(12) United States Patent
Park

(10) Patent No.: US 8,183,080 B2
(45) Date of Patent: May 22, 2012

(54) IMAGE SENSOR AND MANUFACTURING METHOD THEREOF

(75) Inventor: Jin-Ho Park, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 163 days.

(21) Appl. No.: 12/548,006

(22) Filed: Aug. 26, 2009

(65) Prior Publication Data

US 2010/0052085 A1 Mar. 4, 2010

(30) Foreign Application Priority Data

Sep. 4, 2008 (KR) ........................ 10-2008-0087152

(51) Int. Cl.
*H01L 21/00* (2006.01)
(52) U.S. Cl. .......................... 438/70; 257/294
(58) Field of Classification Search .................. 257/432, 257/438, 294; 438/70
See application file for complete search history.

(56) References Cited

U.S. PATENT DOCUMENTS

| | | | |
|---|---|---|---|
| 2002/0086169 A1* | 7/2002 | Nakata et al. | 428/447 |
| 2007/0172974 A1* | 7/2007 | Kim | 438/48 |
| 2008/0135899 A1* | 6/2008 | Park | 257/294 |
| 2008/0157243 A1* | 7/2008 | Cho | 257/432 |
| 2008/0158683 A1* | 7/2008 | Yun et al. | 359/620 |
| 2009/0104547 A1* | 4/2009 | Weng et al. | 430/7 |

* cited by examiner

*Primary Examiner* — Thien F Tran
(74) *Attorney, Agent, or Firm* — Sherr & Vaughn, PLLC

(57) ABSTRACT

An image sensor has a large bridge margin from a repulsive force between adjacent micro lenses having different surface properties. The image sensor has a larger bridge margin with a configuration of a stepped portion between two areas, where the first and the second group of micro lenses are formed, over a planarization layer below these two areas. Thus, a zero gap is realized, where no gap between micro lenses exists, and the fill factor of micro lens is maximized. By the realization of the zero gap, interference effects decrease, noise decreases, and fill factor increases, and thus the sensitivity of an image sensor increases, especially the green sensitivity.

7 Claims, 5 Drawing Sheets

IMAGE SENSOR AND MANUFACTURING METHOD THEREOF

The present application claims priority under 35 U.S.C. 119 to Korean Patent Application No. 10-2008-0087152 (filed on Sep. 4, 2008), which is hereby incorporated by reference in its entirety.

BACKGROUND

An image sensor is a semiconductor device converting an optical image to an electrical signal. Types of image sensors include CCD (Charged Coupled Device) image sensors and CMOS (Complementary Metal Oxide Semiconductor) image sensors.

A CMOS image sensor is a device converting an optical image into an electrical signal using CMOS manufacturing technology. The CMOS sensor adopts a switching method which makes MOS transistors of the number of pixels and uses them to detect outputs in sequence. A CMOS image sensor is, compared to a CCD image sensor, easier to operate, flexible in scanning methods, and scales down final products by integrating image sensing and signal processing circuits into a single chip. Further, since the CMOS image sensor is manufactured using a generally compatible CMOS technology, manufacturing prices can be lowered, and energy consumption of the CMOS image sensor is greatly decreased.

In a manufacturing process of an image sensor, efforts are made to maximize photo sensitivity. One approach is to optimize a light condensing apparatus. For example, a CMOS image sensor includes a light detector which detects light, and a logic circuit which processes detected light to data through an electrical signal. A photodiode is used as a light detector. When manufacturing a CMOS image detector with this configuration, the area of the light detectors over the entire image sensor needs to be increased to increase photo sensitivity. However, an area used for the logic circuit limits the area of light detector because the light detector can only be formed where the logic circuit is excluded. Thus, light condensing technologies which alter the path of light being projected onto areas other than the light detector have been studied. One of the light condensing technologies is a micro lens over a color filter of the image sensor.

Figure 1A:
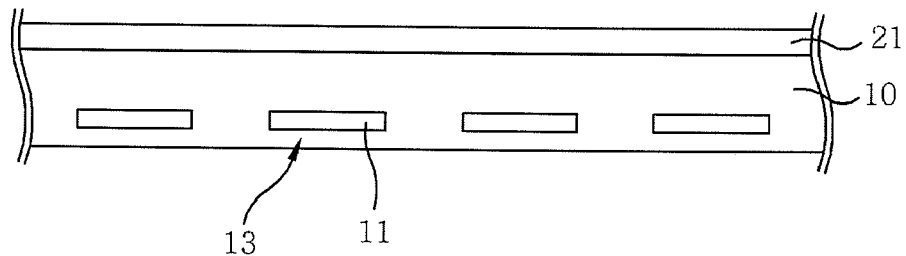

An image sensor with such a micro lens and manufacturing method thereof in accordance with the related art is explained by referring to FIGS. 1A to 1E, which are cross-sectional views of a semiconductor device. As illustrated in FIG. 1A, for example, a silicon nitride film-based protective layer 21 is formed over a semiconductor substrate 10, which has a light detector 13 including photodiode 11 and a circuit bonding pad. The circuit bonding pad is exposed by a photolithography process for removing the protective layer formed over the circuit bonding pad. Here, the photolithography process is performed by: coating photoresist and patterning it; removing parts of the protective layer 21 by etching; and removing remaining photoresist by reactive ion etching.

Figure 1B:
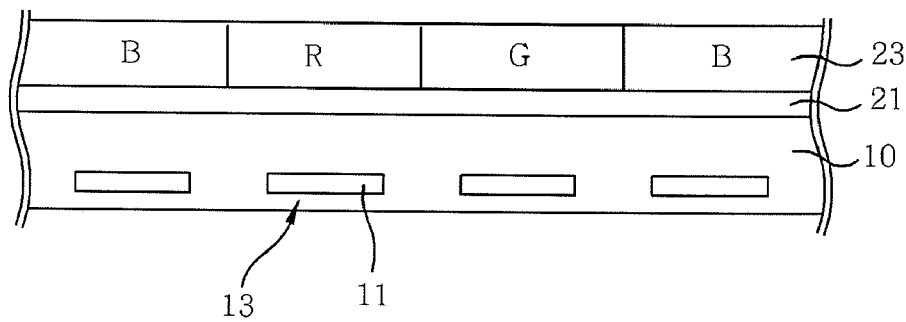

Thereafter, as illustrated in FIG. 1B, a color filter array 23 is formed over the protective layer 21. Here, the color filter array 23 is a combination of a red filter R, green filter G, and blue filter B formed by coating, exposing, and developing photoresist which includes pigments of specific colors such as red, green, and blue.

Figure 1C:
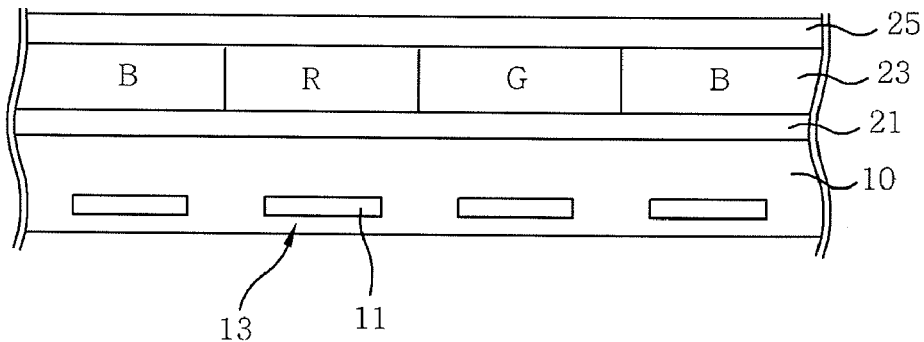

Then, as illustrated in FIG. 1C, a planarization layer 25 is formed over the color filter array 23. The planarization layer 23 is for stepped portion restoration of the color filter layer 23, uniform manufacturing and focal distance control of the micro lenses 27. Here, the planarization layer 25 can be formed with an insulating film such as photoresist, oxide film, or nitride film.

Figure 1D:
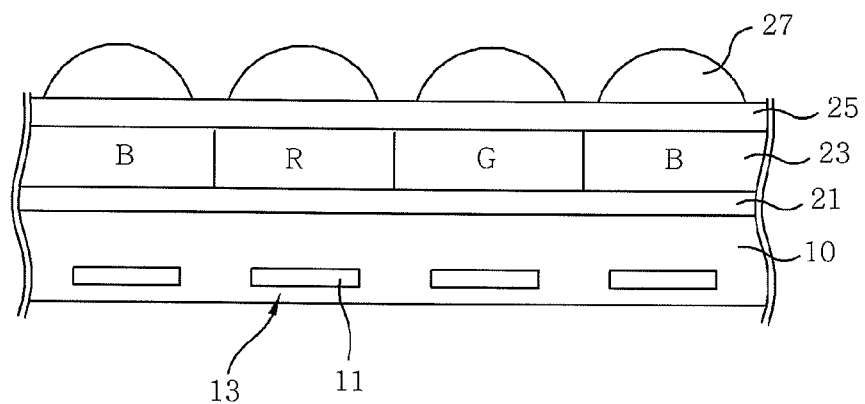

Next as illustrated in FIG. 1D, the photoresist is sequentially coated, exposed, and developed over a surface of the planarization layer 25. Then, micro lenses 27 are formed by bleaching the photoresist, heat-processing to reflow the photoresist to shape lenses, and hardening.

Figure 1E:
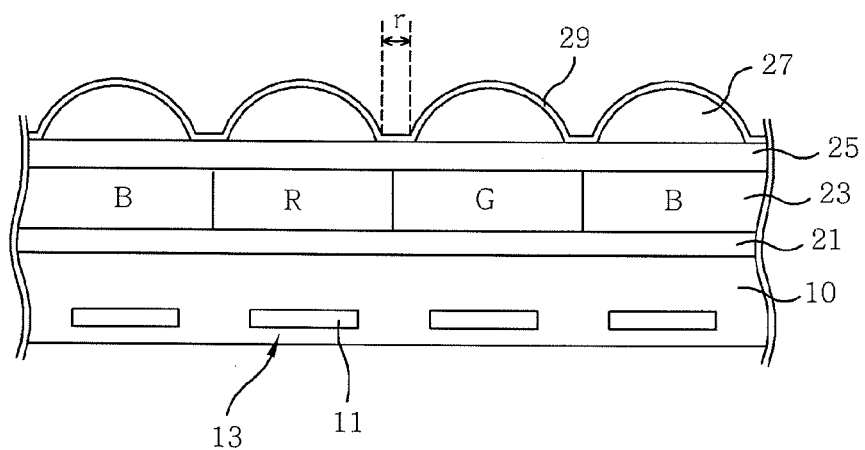

Thereafter, as illustrated in FIG. 1E, a protective layer 29 is formed over the micro lenses 27. Since the photoresist used as the micro lenses 27 is a weak solid, the micro lenses 27 can be broken when particles generated from wafer sawing are stuck on the surface, and therefore, the protective layer 29 is used. Here, the protective layer 29 is a deposition of USG (Undoped Silicate Glass) at a low temperature (at about 180° C.), and this is called LTO (Low Temperature Oxide).

As illustrated above, in the related art, the image sensor obtained by an image sensor manufacturing method has gaps r to prevent bridge phenomenon between adjacent micro lenses 27. The gaps r decrease fill factor of micro lenses 27 and light incident through those gaps cause crosstalk. These problems are increasingly significant as devices are miniaturized.

SUMMARY

Embodiments relate to an image sensor and manufacturing method thereof, and more particularly, an image sensor and manufacturing method thereof with adjacent micro lenses having different surface properties. Embodiments relate to an image sensor of which adjacent micro lenses have different surface properties to thereby ensure wide bridge margins by a repulsive force formed therebetween, and a manufacturing method for forming the image sensor.

The bridge margin can be more widely ensured by providing a stepped portion in a planarization layer, on which an area where a micro lens group of a first type of surface property and an area where a micro lens group of a second type of surface property are formed, to keep a stepped portion between the areas.

Embodiments relate to an image sensor which may include a semiconductor substrate, a light detector formed in the semiconductor substrate, a first group of micro lenses formed over the semiconductor substrate and separated from each other, each micro lens in the first group of micro lenses having a first surface property, and a second group of micro lenses formed between the first group of micro lenses, each micro lens in the second group of micro lenses having a second surface property.

Here, the image sensor may further include a planarization layer formed over the semiconductor substrate and below the first and second groups of micro lenses, wherein the planarization layer has stepped portions corresponding to areas where the first group of micro lenses are formed, and stepped portions corresponding to areas where the second group of micro lenses are formed.

The first surface property may be hydrophilic, and the second surface characteristic may be hydrophobic.

Embodiments relate to an image sensor manufacturing method which may include: forming, over a semiconductor substrate having a light detector and a color filter array, a first group of micro lenses, which are separated from each other by a specific distance and have a second surface property; changing the second surface property to a first surface property by performing a process on the first group of micro lenses; and forming a second group of micro lenses between the first group of micro lenses, the second group of micro lenses having the second surface property.

Here, said modifying the second surface property to the first surface characteristic may include exposing the first group of micro lenses in an oxygen plasma. Forming the first group micro lenses may include forming a planarization layer over the semiconductor substrate and forming the first group of micro lenses over the planarization layer. Modifying from the second surface property to the first surface property may be performed while forming stepped portions over the planarization layer by etching the first group of micro lenses and areas of the planarization layer where the second group of micro lenses are to be formed. The first surface property may be hydrophilic and the second surface property may be hydrophobic.

In accordance with embodiments, adjacent micro lenses have different surface properties to generate a repulsive force therebetween, thereby ensuring a large bridge margin. Further, the planarization layer formed under an area where micro lens group of a first surface property and an area where micro lens group of the second surface property has a stepped portion in corresponding areas to the areas to ensure a larger bridge margin.

With this, fill factor of the micro lenses increases by realizing a zero gap, in which there is no gap between micro lenses. Noise decreases because interference effects decrease from the realization of zero gap. By increasing the fill factor, the sensitivity of an image sensor is improved, especially the green sensitivity.

DRAWINGS

FIGS. 1A to 1E are cross-sectional views of a semiconductor device for explaining a related manufacturing method of an image sensor.

Figure 2:
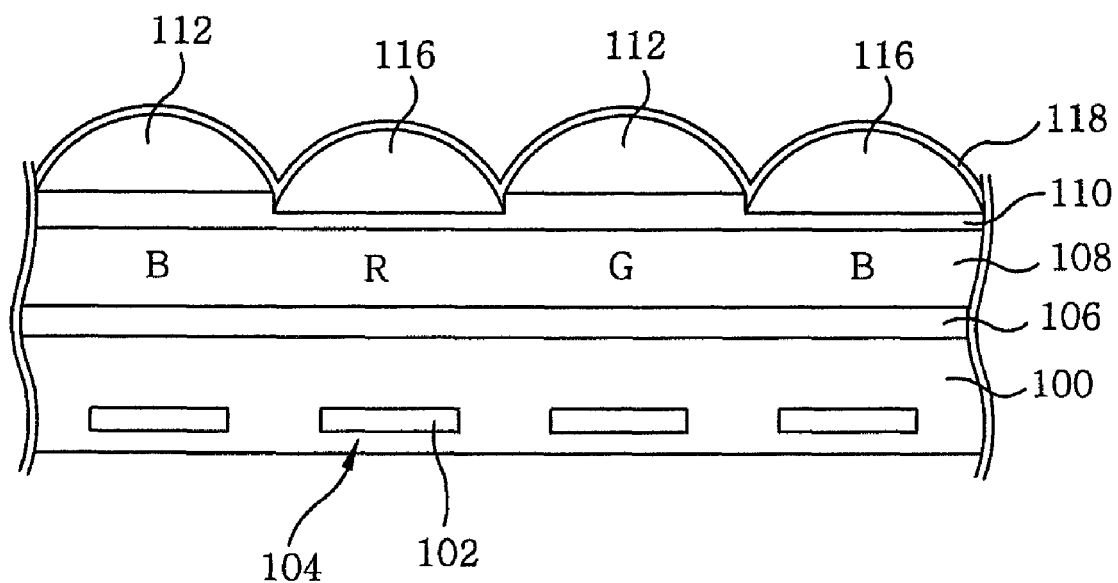

Example FIG. 2 is a cross sectional view of an image sensor formed by using the image sensor manufacturing method in accordance with embodiments.

Example FIGS. 3A to 3F are cross sectional views of a semiconductor device for explaining the image sensor manufacturing method of a image sensor in accordance with embodiments.

DESCRIPTION

Example FIG. 2 is a cross sectional view of an image sensor formed by using the image sensor manufacturing method in accordance with embodiments. Referring to example FIG. 2, the image sensor of embodiments may include a semiconductor substrate 100 having a light detector 104 and a color filter array 108; a planarization layer 110 having stepped portions corresponding an area where a first group of micro lenses 112 may be formed and an area where a second group of micro lenses 116 may be formed; a first group of micro lenses 112 and a second group of micro lenses 116. The second group of micro lenses 116 is formed to be closer to the semiconductor substrate 100 than the first group of micro lenses 112. The first group of micro lenses 112 has a hydrophilic surface property and the second group of micro lenses 116 has a hydrophobic surface property. Further, reference numeral 102 indicates a photodiode forming the light detector 104 and reference numeral 118 is a protective film.

The configuration of the image sensor can be understood by referring to the manufacturing method in accordance to embodiments described below. Example FIGS. 3A to 3F are cross sectional views of a semiconductor device for explaining the image sensor manufacturing method in accordance with embodiments.

Figure 3A:
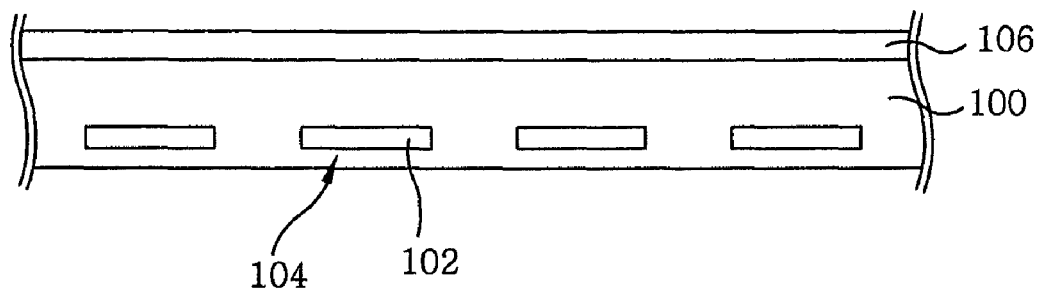

As illustrated in example FIG. 3A, a silicon nitride film based protective layer 106 may be formed over a semiconductor substrate 100 which has a light detector 104 including photodiode 102 and at least one circuit bonding pad. The circuit bonding pad may be exposed by performing a photolithography process to remove a part of a protective layer 106 formed over the circuit bonding pad. In the photolithography process, photoresist is first coated and patterned. A part of the protective film 106 is removed by etching, and the remaining photoresist is removed by reactive etching.

Figure 3B:
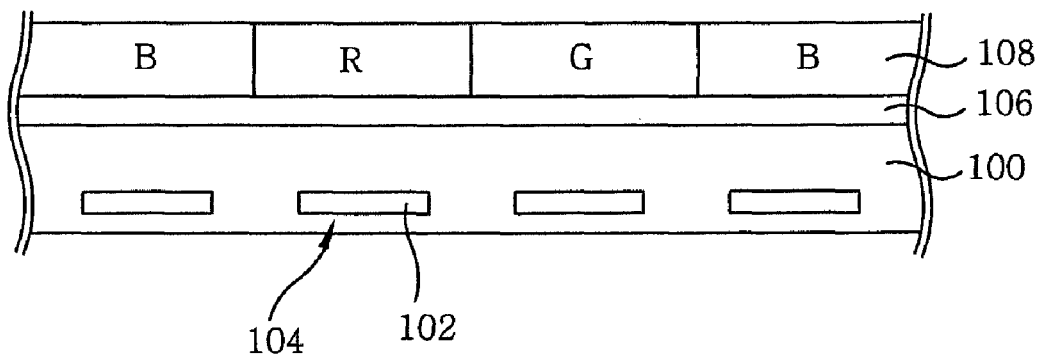

As illustrated in example FIG. 3B, a color filter array 108 may be formed over the protective layer 106. The color filter array 108 may be a combination of a red filter R, green filter G, and blue filter B formed by coating, exposing, and developing photoresist which includes pigments of specific colors such as red, green, and blue.

Figure 3C:
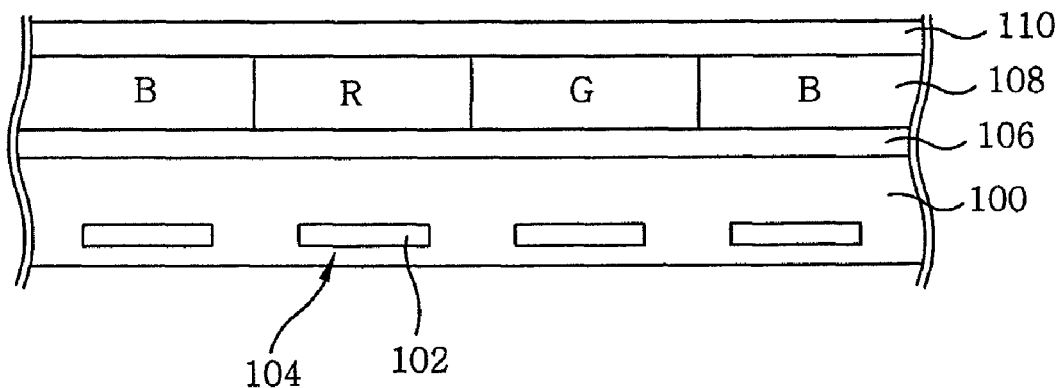

As shown in example FIG. 3C, a planarization layer 110 may be formed over the color filter array 108. The planarization layer 110 may be used for stepped portion restoration of the color filter layer 108, uniform manufacturing and focal distance control of micro lens 112 and 116, which will be described later by referring to example FIG. 3F, and can be omitted. The planarization layer 110 may be formed with an insulating film such as photoresist, oxide film, or nitride film.

Figure 3D:
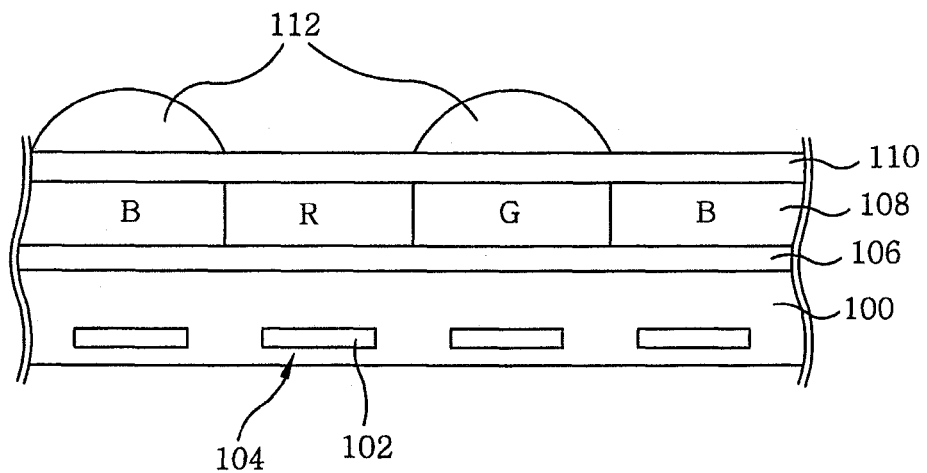

As shown in example FIG. 3D, the first group of micro lenses 112 is a set of micro lenses each of which is every second lens chosen to be formed over a planarization layer 110, depending on the design of the image sensor. To form the first group of micro lenses 112, the photoresist may be coated over a surface of the planarization layer 110. Then, the photoresist may be exposed, developed and bleached. Using heat processing, the photoresist may be reflowed, to shape lenses, and then hardened, to form the first group of micro lenses 112. Here, a surface property of the first group of micro lenses 112 has hydrophobic property which has a low water-affinity.

Figure 3E:
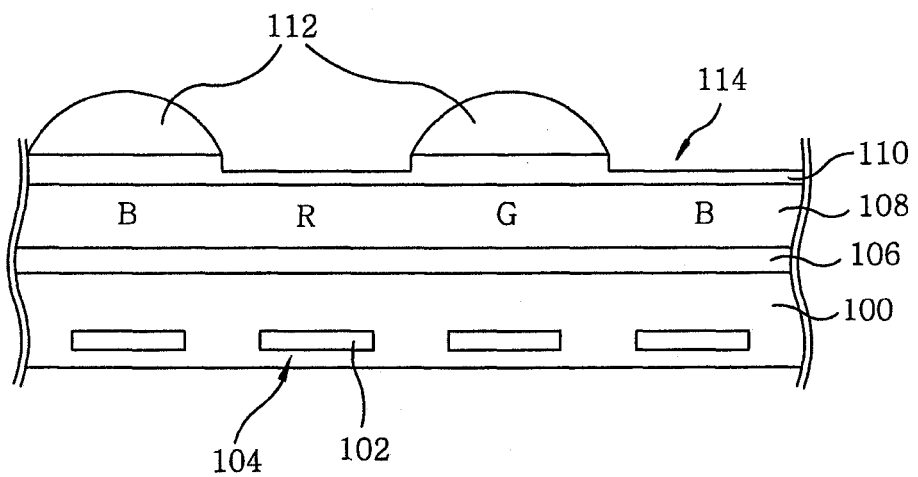
Figure 3F:
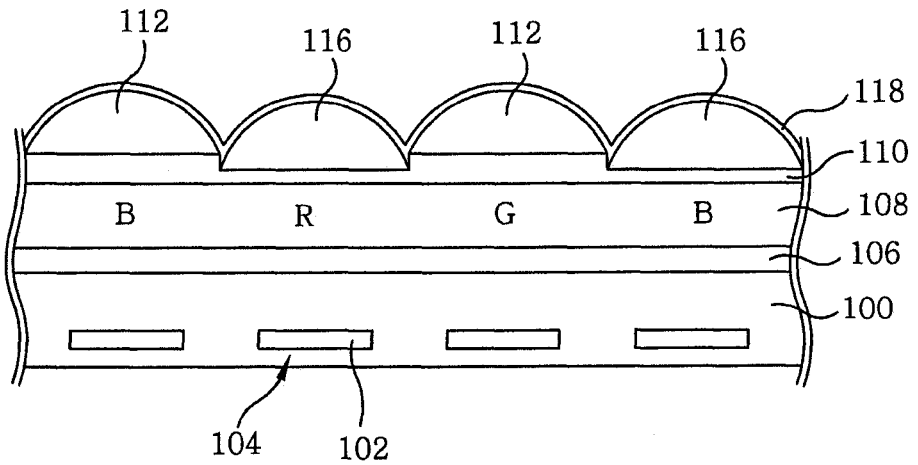

As illustrated in example FIG. 3E, the surface property of the first group of micro lenses may be changed from hydrophobic to hydrophilic, or in other words to have a high water affinity, by processing the surface of the lenses. Here, if the first group of micro lenses 112 may be exposed to an oxygen plasma, so that the surface can be changed from hydrophobic to hydrophilic.

The second group of micro lenses 116 may be defined as all the remaining micro lenses, by excluding the first group of micro lenses 112 from all lenses to be formed over the planarization layer 110, depending on the design of the image sensor. In accordance with embodiments, the second group of micro lenses 116 may have stepped portions 114 between the first group of micro lenses 112 and the second group of micro lenses 116, as the surface property of the first group of micro lenses 112 has been modified. With this, a wide margin may be ensured to prevent the bridge effect between micro lenses.

To achieve this, stepped portions 114 in the planarization layer 110 may be formed by performing reactive ion etching on the first group of micro lenses 112 and the areas of the planarization layer 110 over which the second group of micro lenses 116 is to be formed, as the surface property of the first group of micro lenses 112 is modified from hydrophobic to hydrophilic.

As illustrated in 3F, to form the second group of micro lenses 116, photoresist may be coated over the surface of the planarization layer 110. Then, the photoresist may be exposed, developed and bleached. Then, it may be reflowed by heat processing to shape lenses. The photoresist may then be hardened to form the second group of micro lenses 116. Here, the surface property of the second group of micro lenses 116, unlike the first group of micro lenses 116 which is modified to have a hydrophilic property, has a hydrophobic property. Therefore, a repulsive force is generated between the first group of micro lenses 112 and the second group of the micro lenses 116, whereby the bridge effect between the adjacent micro lenses may be prevented. Further, the stepped portions 114 ensure a wide margin between micro lenses, thereby further preventing the bridge effect. Thus, as can be seen from FIG. 1E and example FIG. 3F, while gaps r exist between micro lenses in the related art, zero gap is realized between the micro lenses in embodiments.

Next, a protective layer 118 may be formed over the groups of micro lenses 112 and 116. The protective layer 118 is formed because the photoresist used to form micro lenses 112 and 116 is a weak solid. The groups of micro lenses 112 and 116 may be broken when particles generated from wafer sawing become stuck on the surface of the lenses. Here, a protective layer 118 can be formed by depositing silicon dioxide ($SiO_2$) at a low temperature. As in the related art, the silicon dioxide may also be called an LTO (Low-Temperature Oxide), because oxide film is deposited at a low temperature.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising;
    forming a planarization layer over a semiconductor substrate having a light detector and a color filter array;
    forming a first group of micro lenses over the planarization layer, which are separated from each other by a specific distance and have a second surface property;
    changing the surface property of the first group of micro lenses from the second surface property to a first surface property by performing a process on the first group of micro lenses while forming stepped portions over the planarization layer by etching the first group of micro lenses and areas of the planarization layer where a second group of micro lenses are to be formed; and
    forming the second group of micro lenses between the first group of micro lenses, the second group of micro lenses having the second surface property.

2. The method of claim 1, wherein said changing the second surface property to the first surface property includes exposing the first group of micro lenses to an oxygen plasma.

3. The method of claim 2, wherein the planarization layer is an insulating film made of one of a photoresist, an oxide film and a nitride film.

4. The method of claim 1, wherein the first surface property is hydrophilic.

5. The method of claim 1, wherein the second surface property is hydrophobic.

6. The method of claim 1, further comprising forming a protective layer over the first group of lenses and the second group of lenses.

7. The method of claim 6, wherein the protective layer is formed by depositing silicon dioxide at a temperature in a range from 180 to 220° C.

* * * * *